United States Patent [19]

Caporaso et al.

[11] Patent Number: 4,579,622

[45] Date of Patent: Apr. 1, 1986

[54] HYDROTHERMAL CRYSTAL GROWTH PROCESSES

[75] Inventors: Anthony J. Caporaso, Summit; Ernest D. Kolb, New Providence; Robert A. Laudise, Berkeley Heights, all of N.J.

[73] Assignee: AT&T Bell Laboratories, Murray Hill, N.J.

[21] Appl. No.: 542,392

[22] Filed: Oct. 17, 1983

[51] Int. Cl.[4] .............................................. C30B 7/10
[52] U.S. Cl. ....................... 156/623 R; 156/DIG. 61; 156/DIG. 72; 156/DIG. 77
[58] Field of Search ....... 156/623 R, 623 Q, DIG. 61, 156/DIG. 72, DIG. 77

[56] References Cited

U.S. PATENT DOCUMENTS

| | | | |
|---|---|---|---|
| 3,013,867 | 12/1961 | Sawyer | 156/DIG. 61 |
| 3,201,209 | 8/1965 | Caporaso et al. | 156/DIG. 77 |
| 3,356,463 | 12/1967 | Ballman et al. | 156/623 Q |
| 3,496,108 | 2/1970 | Kolb et al. | 156/623 R |
| 4,019,950 | 4/1977 | Croxall et al. | 156/623 R |
| 4,300,979 | 11/1981 | Kolb et al. | 156/623 R |

Primary Examiner—David L. Lacey
Attorney, Agent, or Firm—Bruce S. Schneider

[57] ABSTRACT

High quality crystals of materials that are essentially silicon-free are produced in a low pressure hydrothermal growth process through a specific expedient. In particular, the aqueous solution utilized in the pressure vessel during growth is introduced in significantly larger quantities than previously thought to be acceptable.

7 Claims, 3 Drawing Figures

HYDROTHERMAL CRYSTAL GROWTH PROCESSES

BACKGROUND OF THE INVENTION

1. Field of the Invention

This invention relates to crystal growth and, in particular, hydrothermal crystal growth.

2. Art Background

The hydrothermal process is utilized for growing a wide variety of crystals. In this process typically a pressure vessel, e.g., a cylindrical pressure vessel, having a baffle or other means to produce a temperature gradient is partially filled at room temperature with an aqueous solution—a growth medium. Crystal nutrient material is introduced on one side of the baffle (or gradient) and seed crystals are introduced on the other. The pressure vessel is sealed and heating is initiated. (This heating is introduced on the nutrient end when the solubility of this nutrient increases with increasing temperature and on the crystal end when solubility decreases with increase in temperature.) As the temperature rises, the growth medium expands, fills the vessel, and produces a significantly elevated internal pressure.

These elevated pressures, e.g., above 15,000 psi, are advantageously utilized in the growth of silicon containing crystals such as quartz crystals. Silicon in the growth medium reacts with the steel pressure vessel to form an iron silicate compound. This silicate coating is resistant to the typically corrosive growth medium, and thus the integrity of the vessel walls are maintained even at high pressures. Nevertheless, high pressures are unacceptable for the growth of essentially silicon-free crystalline compositions, e.g., compositions such as aluminum phosphate, sapphire, ruby, yttrium iron garnet, yttrium aluminum garnet, and II-VI compounds such as zinc oxide, zinc sulfide, or zinc selenide, and other materials having less than 5 mole percent silicon content. If silicon is not present in the growth medium, the vessel walls are not protected and do undergo corrosion. Thus, a pressure vessel with corrosion resistant internal surfaces (surfaces containing noble metals, gold, or silver) is required for growth of silicon-free crystals—crystals that are significant for jewelry and electronic device applications. However, high pressure vessels having only noble metal surfaces in contact with the growth medium and having cross-sectional dimensions large enough (larger than ¾ inch) to accommodate the expeditious growth of reasonably sized crystals have not been developed. Thus, for the growth of essentially silicon-free crystals, nominal pressures, i.e., pressures below 15,000 psi, are necessitated by the design limitations of the vessel.

To ensure that nominal pressures are encountered during the growth of substantially silicon-free crystals, compositions such as hydroxides, fluorides, phosphates, borates, and chlorides (typically denominated mineralizers) are added to the growth medium. These mineralizers have the effect of decreasing the pressure encountered at a given temperature while increasing the solubility of the nutrient in the growth medium. Despite the reductions in pressures achieved through addition of mineralizers, for obvious safety reasons, care must be taken to maintain relatively low pressures. If an excessive volume of growth medium is initially present in the pressure vessel, as the growth temperature is approached, the pressure increases not only to the level attained when the medium expands to fill the vessel, but thereafter rapidly accelerates to dangerous levels. Pressure vessel temperature curves for various fill levels are not available for medium containing mineralizers but are available for pure water. (See, G. C. Kennedy, *American Journal of Science*, 248, p. 540 (1950).) Unsafe conditions are generally avoided by initially filling the vessel to a level that is only slightly greater, i.e., less than 5 percent greater, than that yielding acceptable pressures in the absence of a mineralizer.

SUMMARY OF THE INVENTION

It has been found that the introduction of a mineralizer depresses the pressure at a given temperature far beyond the degree presently contemplated. In fact, it has been found that unless the percentage fill is increased at least one-tenth fold over the level utilized to fill the vessel at the growth temperature in the absence of a mineralizer, complete filling of the vessel does not occur. This incomplete filling leads to degradation of reproducibility and crystal quality.

DETAILED DESCRIPTION

Figure 1:
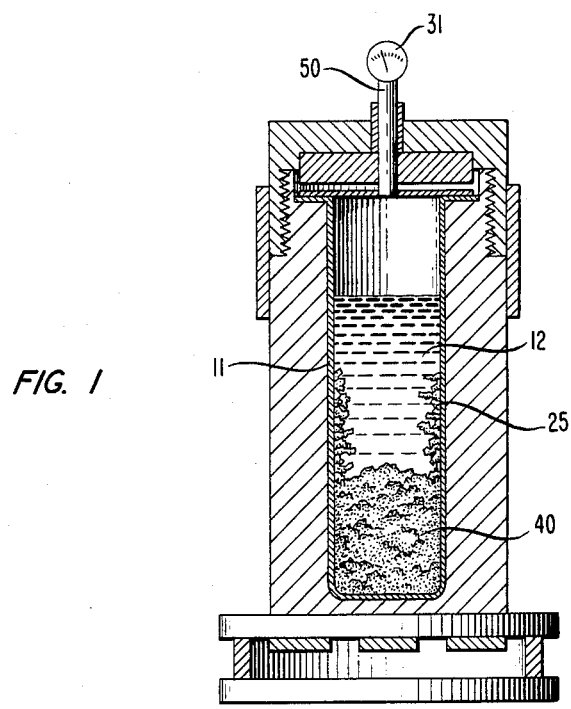
FIGS. 1 and 2 are illustrative of apparatuses useful for practicing the subject invention.

The invention involves the use of significantly higher growth medium fills in the hydrothermal growth of essentially silicon-free crystals. The invention is suitable, for example, in jewelry and device applications, for crystals that are substantially silicon free, e.g., sapphire, ruby, yttrium iron garnet, yttrium aluminum garnet, and II-VI compositions such as zinc oxide, zinc sulfide, and zinc selenide. In each case nutrient and seed crystals or other nucleation points such as vessel walls are provided in the reaction vessel as previously discussed. The particular nutrient utilized for growing a crystal having a desired composition is well known and is found in various review articles such as R. A. Laudise, "Hydrothermal Growth," in *Crystal Growth: An Introduction*, edited by W. Bardsley et al, North-Holland Publishing Co., Amsterdam (1973). Similarly, the mineralizers utilized for growing a particular crystal have also been extensively investigated and discussed in review articles such as R. A. Laudise, supra. For example, $K_2CO_3$ is suitable for sapphire, potassium hydroxide for zinc oxide and yttrium iron garnet, sodium hydroxide for yttrium aluminum garnet, and either phosphoric acid or hydrochloric acid for aluminum phosphate. For the inventive technique, the particular mineralizer employed is not critical. However, the mineralizer is chosen through the use of a controlled sample to yield suitable results for growth of a desired crystal composition. Similarly, the concentrations of the mineralizer are not critical. Generally, mineralizer cxoncentrations in the range 0.5 to 20 molar are employed. Typically, concentrations less than 0.5 molarity are not suitable since the nutrient has an excessively low solubility in such weak solutions and thus crystal growth is unacceptably slow. Concentrations above 20 molarity are also typically disadvantageous since there is a tendency to induce crystallization of unwanted materials through the formation of products that are more stable than the desired composition. For example, in the case of aluminum phosphate growth, an excessive presence of HCl leads to the possibility of aluminum chlorophosphate crystal formation.

The growth temperature utilized also depends on the particular composition to be grown. (The growth temperature is considered the lowest temperature during the growth procedure at which a non-negligible degree of crystal growth is inducible.) The temperature range is delimited by the regime in which the desired crystal phase exists. For example, aluminum phosphate is the stable phase in the temperature range 150 degrees C. to 584 degrees C. Below 150 degrees C. $AlPO_4.2H_2O$ is produced while above 584 degrees C. the desired $\alpha$ form, the form which is piezoelectric, is no longer stable and undesirable phases are produced. Within the conditions imposed by phase considerations, a temperature should be employed that avoids an excessive growth period by producing a sufficiently high nutrient dissolution and crystal growth rate. Generally, for a crystal of desirable dimensions for device applications, i.e., having lengths of at least 0.25 cm, growth rates of at least 0.25 mm (10 mils)/day are advantageous to maintain an economic process. (For production of gem crystals, smaller crystals, e.g., 0.5 mm, and thus correspondingly lower rates, are acceptable.) Crystal quality is also somewhat dependent on growth temperature. The relationship between crystal quality and temperature depends on crystal composition and is not a priori discernible. A control sample is utilized to determine the precise conditions desired for a specific crystal composition.

The configuration of the growth apparatus depends upon the solubility behavior of the crystal. Most materials become more soluble as temperature increases. A configuration useful for crystals having this solubility behavior is shown in FIG. 1. As indicated in this Figure, 12 is the growth medium, 11 is a noble metal liner, and 40 is the nutrient material. Heating is controlled so that a thermal gradient between the nutrient region (hotter region) and the seed region (colder region) where seed nucleation, 25 is initiated on the vessel walls or on a seed crystal, is established and, in turn, a thermodynamic driving force for crystal growth in the seed region is produced. (The nutrient region is the portion of the growth medium occupied by the nutrient.) In one embodiment, this gradient is established by introducing heat in the nutrient material region. (It is possible to establish this gradient through use of a baffle.)

Figure 2:
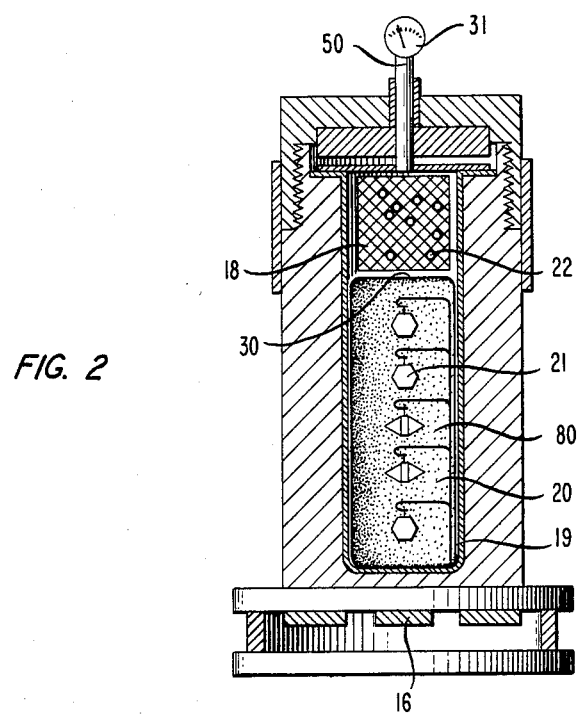

In contrast, if the material solubility decreases with increasing temperature, the configuration of FIG. 2 is desirable. A thermal gradient from the seed region (hotter region) to the nutrient region (colder region) is established with, for example, heaters, 16. In one embodiment a baffle, 30, a growth medium, 20, a seed crystal, 21, and nutrient, 22, held in a basket, 18, are utilized with heat through, for example, heaters, 16, being introduced in the seed region. It is also desirable, but not essential, that the seed region occupies the upper, not the lower, portion of the vessel. In this manner, not only is the appropriate thermodynamic driving force produced but also a thermally induced convection leading to a more efficient circulation of material is attained. It is also desirable when the solubility of the nutrient material decreases with increasing temperature that the growth medium be presaturated, i.e., that before its introduction into the vessel it contains sufficient dissolved nutrient to produce an essentially saturated solution. This presaturation in one embodiment is accomplished by equilibrating the nutrient and the growth medium at the growth temperature, quenching to room temperature, and using the resulting presaturated solution in the growth run. Presaturation significantly increases the speed at which the crystal is formed and prevents total seed dissolution before growth initiation.

As discussed, to attain reproducible growth of quality crystals, the initial growth medium fill of the vessel should be substantially larger than that previously thought advisable. In particular, the fill of the vessel should be at least 0.1 times, preferably 0.15 times, larger than the initial fill of pure water that would fill the vessel at, but not below, the growth temperature. (Initial percentage fill is the volume percentage of the vessel the growth medium occupies at room temperature and atmospheric pressure less the percentage volume occupied by the baffle, seed crystals, and nutrient material.) However, the fill should not be so great that final pressures exceed 15,000 psi. This pressure limit is easily avoided by employing a control sample with a proposed given fill and measuring the final pressure at the growth temperature using, for example, capillary tube, 50, and pressure gauge, 31. For example, in the case of aluminum phosphate growth, a 6M phosphoric acid growth medium with an 80 to 82 percent fill does not produce a completely filled vessel upon heating to the growth temperature of 200 degrees C. Similarly, a 3M HCl medium at the same fill and temperature also does not produce a complete fill at the growth temperature. In contrast, a fill of approximately 92 to 95 percent results in a completely filled vessel and nominal pressures at the growth temperature.

EXAMPLE 1

The apparatus shown in FIG. 1 was utilized to prepare seed crystals and the apparatus of FIG. 2 was utilized where 30 is a baffle and 18 is a wire mesh screen capable of holding nutrient. Each pressure vessel was cylindrical with a cross-section of approximately 1 inch. A pressure gauge, 31, was present at the termination of capillary tube, 50, to measure pressures developed in the vessel. Temperature sensors were also present to measure temperatures during the growth procedure. The vessel was lined with a Pt composition having a thickness of approximately 0.03 inch. All internal surfaces of the chamber presented a Pt composition to the growth medium.

Initially, a growth medium was presaturated and nutrient as well as seed crystals were prepared by employing a supplemental nutrient synthesis run. In this supplemental run an aqueous phosphoric acid solution having a molarity of 12.0 was introduced into the pressure vessel (shown in FIG. 1) to yield a 79 percent corrected fill. Approximately 25 grams of aluminum hydroxide (finer than 100 mesh) was then introduced into region, 40, of the growth region while maintaining the growth medium at 150 degrees C. (The aluminum hydroxide reacts with a portion of the $H_3PO_4$ to form $AlPO_4$.) The pressure vessel was sealed and the temperature was increased at the rate of 5 degrees C. per day until a temperature of 275 degrees C. was reached. The heating was terminated after 25 days and the temperature was rapidly decreased to room temperature by immersing the pressure vessel in water at a temperature of 25 degrees C. The pressure vessel was opened and a large number of crystals having dimensions larger than 30 mesh and occasionally a few having dimensions of a millimeter were present.

Growth of an aluminum phosphate crystal was then accomplished in the apparatus of FIG. 2. The 60 mesh, or larger, crystals produced in the supplemental procedure were introduced as nutrients at 22 in FIG. 2. Seed crystals obtained from carefully built-up crystals from nutrient or similar runs having the exposed crystallographic plane of (0001) were held in region, 80, by 10 mil Pt wire or a 5 mil teflon strip. The temperature was raised as indicated and maintained to produce crystal growth. After the growth period, heating was terminated and the pressure vessel was quenched. An average growth rate of 16 mil/day was achieved. The rate was not reproducible.

EXAMPLE 2

The procedure of Example 1 was followed except a growth medium of 3.05 molar HCl at an initial fill of 82 percent was utilized. The temperature was increased at a rate of 10 degrees per day until the temperature of 225 degrees C. was reached. Growth was induced on the (0001) plane and produced at an average rate of approximately 15 mils per day. The rate was not reproducible.

EXAMPLE 3

The procedure of Example 1 was followed except the medium was at an initial fill of 80 percent and the temperature of the growth medium was rapidly increased to 250 degrees C. The temperature was maintained at 250 degrees C. during the entire growth run of 25 days with the temperature of the seeds being maintained at a temperature of 20 degrees higher than that of the nutrient. Again, the growth rate was not reproducible and averaged approximately 7 mils per day. (The growth rate for Examples 1 through 3 was discerned by measuring from tip-to-tip of the grown crystal and included dimensions produced by capping growth along the $(01\bar{1}1)$ plane.)

EXAMPLE 4

The procedure of Example 3 was utilized except a 7.58 molar phosphoric acid solution was utilized with an initial fill of 95 percent and maintained at a temperature of 170 degrees C. A temperature differential of 20 degrees C. between the nutrient region and the seed region was maintained for a period of 25 days. Growth along the (0001) plane produced at a rate of 24 mils per day and was consistently reproducible.

EXAMPLE 5

The procedure of Example 3 was followed except a 6 molar HCl solution with an initial fill of 92 percent and an initial temperature of 190 degrees C. was employed. The temperature was slowly reduced during the growth run to a temperature of 170 degrees C. with a temperature differential of 20 degrees C. being maintained. A growth rate of approximately 40 mils per day was achieved and this growth rate was quite reproducible.

Figure 3:
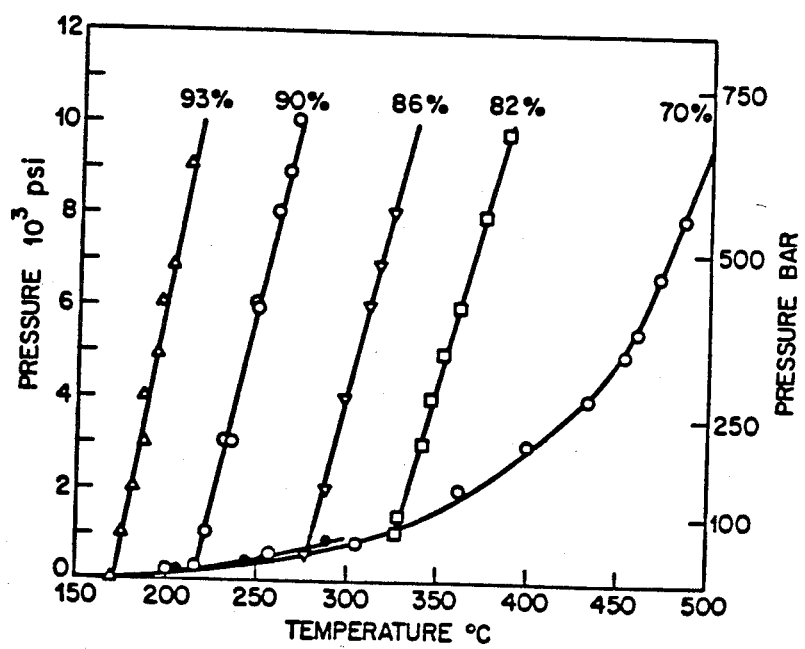
FIG. 3 illustrates conditions involved in the practice of the invention.

Crystals of suitable quality were consistently obtained at percentage fills larger than 90. Pressure versus temperature curves for various fill percentages and compositions are shown in FIG. 3.

What is claimed is:

1. A process for growth of an essentially silicon-free crystal at an elevated growth temperature comprising the steps of partially filling a pressure vessel having internal surfaces comprising a noble metal with an aqueous growth medium that contains a mineralizer in the presence of a nutrient for growth of said crystal and inducing growth of said crystal at said growth temperature wherein said partial fill is sufficient to cause complete fill of said vessel at said growth temperature but insufficient to produce a pressure above 15,000 psi.

2. The process of claim 1 wherein said minerlizer and said nutrient are selected such that said crystal comprises AlPO$_4$.

3. The process of claim 2 wherein said aqueous medium comprises hydrochloric acid.

4. The process of claim 2 wherein said aqueous medium comprises phosphoric acid.

5. The process of claim 1 wherein said aqueous medium comprises hydrochloric acid.

6. The process of claim 1 wherein said aqueous medium comprises a phosphoric acid.

7. The process of claim 1 wherein said internal surfaces comprise a metal vessel liner.

* * * * *